United States Patent [19]
Morita et al.

[11] Patent Number: 5,506,168
[45] Date of Patent: Apr. 9, 1996

[54] METHOD FOR MANUFACTURING SEMICONDUCTOR DEVICE

[75] Inventors: Shigeru Morita, Fujisawa; Fumitomo Matsuoka, Kawasaki, all of Japan; Hisao Yoshimura, Poughkeepsie, N.Y.; Takeo Maeda, Tokyo, Japan

[73] Assignee: Kabushiki Kaisha Toshiba, Kawasaki, Japan

[21] Appl. No.: 321,132

[22] Filed: Oct. 11, 1994

Related U.S. Application Data

[62] Division of Ser. No. 144,057, Oct. 27, 1993, abandoned.

[30] Foreign Application Priority Data

Oct. 27, 1992 [JP] Japan .................................. 4-288697

[51] Int. Cl.⁶ ...................................................... H01L 21/76
[52] U.S. Cl. ........................... 437/67; 437/228; 156/636.1
[58] Field of Search ............. 437/67, 228; 148/DIG. 50, 148/DIG. 85, DIG. 86; 156/636, 636.1

[56] References Cited

U.S. PATENT DOCUMENTS 4,160,991  7/1979  Anantha et al. .

FOREIGN PATENT DOCUMENTS

| 5950541 | 9/1982 | Japan . |
|---|---|---|
| 6097661 | 11/1983 | Japan . |
| 1107554 | 10/1987 | Japan . |
| 2304926 | 5/1989 | Japan . |
| 316152 | 6/1989 | Japan . |

*Primary Examiner*—George Fourson
*Attorney, Agent, or Firm*—Loeb and Loeb

[57] ABSTRACT

A method for manufacturing a semiconductor device of the present invention has the step of forming an insulation material on a main surface of a semiconductor substrate. A groove is formed to extend from the surface of the material film to the substrate. The groove is buried with a first insulation film. By use of the first insulation film as an etching mask, the material film is removed, so that a projecting portion projecting to the first insulation film from the main surface can be obtained. A second insulation film is formed on a side surface or the projecting portion in a slope shape, which is from the top portion of the projecting portion to the main surface.

1 Claim, 9 Drawing Sheets

1

METHOD FOR MANUFACTURING SEMICONDUCTOR DEVICE

This is a divisional of application Ser. No. 08/144,057, filed on Oct. 27, 1993, now abandoned.

BACKGROUND OF THE INVENTION

1. Field of the Invention

The present invention relates to a method for manufacturing a semiconductor device having a device separation area of burying type, and more particularly to a method for manufacturing a semiconductor device in which a groove formed on a substrate and a resist pattern are positioned by self-alignment to be useful to make an integrated circuit fine.

2. Description of the Related Art

In accordance with fining the integrated circuit, the separation distance between the devices has been made smaller every generation. A device ,separation area of burying type has been used.

A conventional device separation area of burying type and its manufacturing method will be explained with reference to FIGS. 1 to 5.

FIGS. 1 to 5 are cross sectional views showing the conventional device separation area of burying type shown by every main process.

First, as shown in FIG. 1, a silicon oxide film ($SiO_2$) 102 having a thickness of about 100 nm is formed on a silicon (Si) substrate 100 by thermal oxidization. Then, a mask (not shown), formed of photoresist, is formed by photographic etching. By use of such a mask, a groove 104 is formed on the substrate 100 of the device separation forming section by RIE.

Sequentially, a silicon oxide film ($SiO_2$) 106 having a thickness of about 500 nm is formed on the upper entire surface of the substrate 100, and is buried in the groove 4.

As shown in FIG. 2, the silicon oxide film 106 formed on the upper entire surface of the substrate 100 is etched back by RIE, so that a device separation area 108 can be obtained.

The device separation area 108 should be logically formed as shown in FIG. 2. However, in actual, as shown in FIG. 3, the edge of the separation area 108 is caved along a side wall of the groove 104. The side wall portion of the groove 104 is a boundary between different materials of silicon and a silicon oxide film. Due to this, stress concentrates in such an area. Etching in the area where stress concentrates advances faster than an area where stress does not concentrate. Due to this, the edge of the separation area 108 is caved along the side wall of the groove 104.

Moreover, if the substrate 100 is repeatedly etched by the formation of a gate oxidization or isotropic etching during the manufacture, the edge of the separation area 108 may be largely caved along the side wall of the groove 104. If the caved portion is formed, pressure to a diffusion layer 110 to be formed later is lowered, and this may cause increase in reverse leak current. Moreover, in a case where gate electrode covers the caved portion, a threshold voltage is locally reduced by concentration of an electrical field to the substrate corner from the gate electrode, and gate insulation pressure is reduced.

Moreover, as shown in FIG. 5, if a polycrystalline silicon 112 is left on the cave portion of the edge of the separation area to form the gate electrode using polycrystalline silicon to be a predetermined shape by anisotropic etching, short-circuit defective may be caused between the gate electrodes through the residual polycrystalline silicon 112.

The above-mentioned prior art is described in U.S. Pat. No. 4,160,991, Jpn. Pat. Applin. KOKAI publication No. 59-50541, and Jpn. Pat. Applin. KOKAI publication No. 60-97661.

In order to prevent the disadvantage caused when the cave portion is formed, an insulation material is buried in the groove, and the upper portion of the groove is capped with the other insulation material. Then, the insulation materials are processed by use of the resist pattern by photographic etching. As a result, the insulation materials cover the semiconductor substrate over a fixed range of the surroundings of the groove, thereby preventing the cave portion from being formed.

In processing the insulation materials, a difference in level is easily generated between the insulation materials and the semiconductor substrate. In the post-processes, the difference level may cause a wiring process defective such as short-circuit between the electrodes due to the rest of etching.

In order to prevent such a problem, it has been known that an inclination is formed on the side surface of the insulation material to smoothly connect the wire to the semiconductor substrate.

Such a technique is disclosed in e.g., Jpn. Pat. Applin. KOKAI publication No. 2-304926, Jpn. Pat. Applin. KOKAI publication No. 3-16152 and Jpn. Pat. Applin. KOKAI publication No. 1-107554.

However, in the technique disclosed in the above documents, the size of the area of the resist pattern must be larger than the width of the groove in consideration of positioning the resist pattern and the groove. This fails to satisfy the requirement of making the integrated circuit fine. Moreover, the inclination can be formed on the side surface of the insulation material by isotropic etching in which impurity ion is implanted into the surface of the insulation material and speed increasing etching is provided. However, in consideration of over-etching, an area, which is larger than the surface area of the semiconductor substrate to be covered, is required in the resist pattern. Due to this, since the minimum distance, which is the boundary between the peripheral pattern and the device itself, becomes larger than a desirable minimum distance, the fine processing is interrupted.

SUMMARY OF THE INVENTION

In consideration of the above-mentioned problems, an object of the present invention is to provide a method for manufacturing a semiconductor device in which a groove formed on a substrate and a resist pattern are positioned by self-alignment to be useful to make an integrated circuit fine.

In order to attain the above object, there is provided a method for manufacturing a semiconductor device comprising the steps of forming a material film on a main surface of a semiconductor substrate; forming a groove extending from the surface of the material film to the substrate; burying the groove with a first insulation film; removing the material film by use of the first insulation film as an etching mask so as to obtain a projecting portion projecting to the first insulation film from the main surface; and forming a second insulation film on a side surface of the projecting portion in a slope shape extending from the top portion of the projecting portion to the main surface.

According to the above-mentioned manufacturing method of the semiconductor device of the present invention, the device separation area has a convex portion, that is, the projecting portion on the surface of the substrate. Due to this, even if etching is repeatedly performed, influence due to such a repeated etching such as a reduction of the film is not exerted on the device separation area. Therefore, there is no cave portion to be formed along the side wall of the groove, and the device separation area is shaped enough to separate the device. Moreover, since the device separation area is formed in a slope shape extending from the top portion of the projecting portion to the main surface of the substrate, there is no difference in level. Therefore, even if the deposition of the films/etching are repeatedly performed during the manufacturing processes, no deposit is left around the device separation area, and the possibility that the short-circuit defective, for example, will occur is reduced.

The accompanying drawings, which are incorporated in and constitute a Dart of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
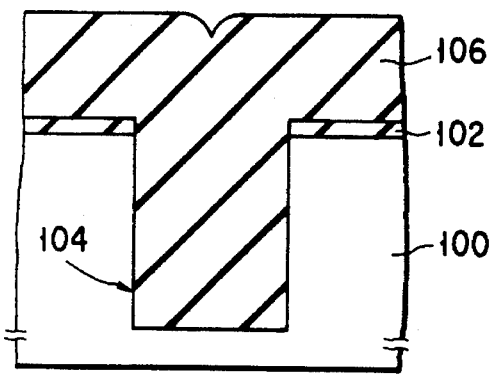
FIGS. 1 to 5 show each process explaining a conventional method for manufacturing a semiconductor device including a device separation area.
Figure 2:
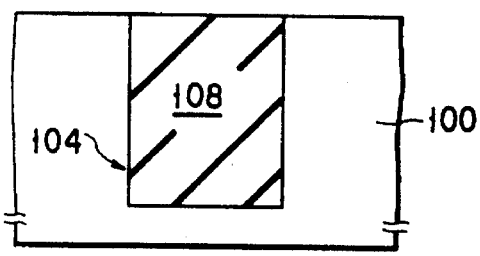

Embodiments of the present invention will be explained with reference to the drawings.

The same reference numerals are added to the same portions through the whole drawings. The explanation will be omitted.

FIGS. 6 to 10 are cross sectional views each showing a device separation area having a different shape of embodiments 1 to 5 of the present invention.

As shown in FIGS. 6 to 10 in common, a groove 2 is formed in a silicon substrate 1. The Groove 2 is buried with an insulation film 3. The insulation film 3 has a projection 4 projecting from the surface of the substrate 1. Further, each of slopes 5a to 5e is formed on the surface of the substrate 1 from the too portion of the projection 4 in each figure.

The slopes 5a to 5e may be formed by an insulating film, which is different from the insulation film 3, or the same insulating film. Particularly, the slope may be formed integrally with the insulation film 3 as shown in the slope 5c of FIG. 8.

The following will explain the semiconductor device manufacturing method having a device separation area of embedding type of the first embodiment of the present invention with reference to FIGS. 11 to 17.

Figure 11:
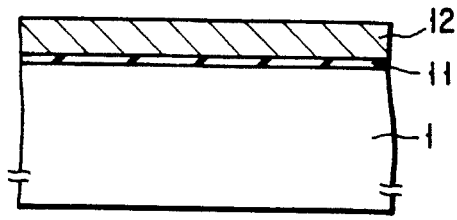
FIGS. 11 to 17 are cross sectional views showing the main processes of the semiconductor device manufacturing method having a device separation area of the first embodiment of the present invention of FIG. 6.

As shown in FIG. 11, a silicon oxide film ($SiO_2$) 11 having a thickness of about 10 nm is formed on the silicon (Si) substrate 1 of P type having a face orientation (100) and a relative resistance of about 1 to 2 $\Omega$·cm. A polycrystalline silicon film 12 having a thickness of about 100 nm is formed on the silicon oxide film 11 by a Chemical Vapor Deposition (CVD).

Figure 12:
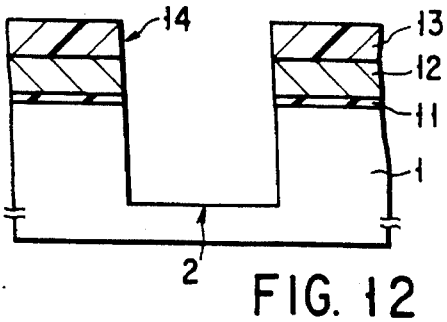

Next, as shown in FIG. 12, the polycrystalline silicon layer 12 is coated with photoresist, thereby obtaining a photoresist film 13. Sequentially, an opening 14, which corresponds to an area where the device separation area is to be formed, is formed on the photoresist film 13. By use of the photoresist film 13, serving as a mask for etching, the polycrystalline silicon film 12, silicon oxide film 11, and substrate 1 are sequentially etched by a Reactive Ion Etching (RIE), which is anisotropic etching, thereby obtaining the groove 2 of a depth of about 500 mn.

Sequentially, after removing the photoresist film 13, impurity of the same conductive type as the substrate 1, such as boron, is ion-implanted to the substrate 1 exposed in the groove 2 by use of the polycrystalline silicon layer 12 as a mask, so that an ion implantation layer 15 is obtained. The ion implantation layer 15 is to be used as an inversion preventing layer.

Figure 13:
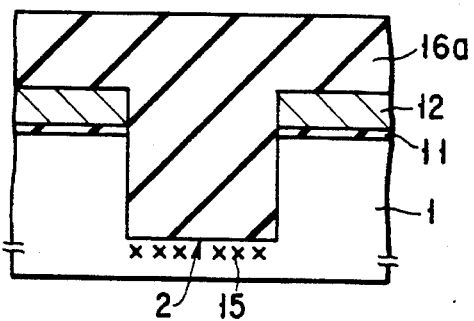

As shown in FIG. 13, burying material of about to 500 nm for the device separation area such as silicon dioxide, organic silane·gas is deposited on the opening 14 and the polycrystalline silicon layer 12 by CVD, so that a silicon oxide film 16a can be obtained.

Figure 14:
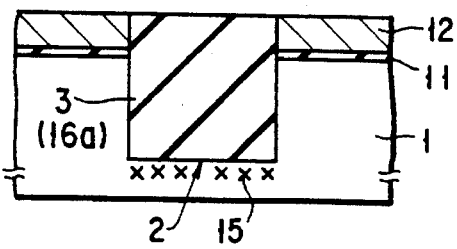

Then, as shown in FIG. 14, the silicon oxide film 16a is etched back by anisotropic etching so as to be flush with the surface of the polycrystalline silicon film 12. Thereby, the silicon oxide film 16a is buried in the groove 2, and used as the burying insulation layer 3.

Figure 15:
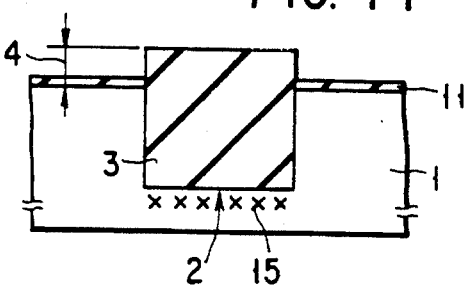

As shown in FIG. 15, after etching back, by use of the burying insulation layer 3 (silicon oxide film) as a mask for etching, the polycrystalline film 12 is removed. Thereby, the projection 4, which projects from the surface of the substrate 1, is formed. This process can be realized by etchant by which silicon can be easily etched and the silicon oxide film cannot be easily etched.

Figure 16:
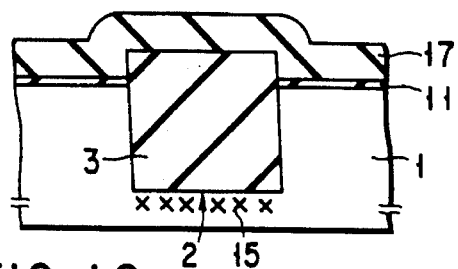

Next, as shown in FIG. 16, a silicon nitrogen film (Si₃N₄) 17 having a thickness of about 50 nm is formed on the insulation film 3 and the silicon oxide film 11 by CVD.

Figure 17:
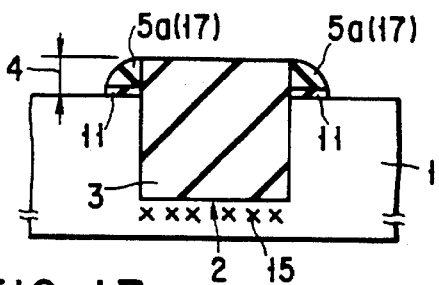

Then, the entire surface of the structure of FIG. 16 is etched back by anisotropic etching, and the silicon nitrogen film 17 is left on the side wall of the projection 4. Thereby, the silicon nitrogen film 17 is formed as the insulation film 5a, which is extended from the top portion of the projection 4 to the surface of substrate in a slope shade manner, as shown in FIG. 17.

By the above-mentioned manufacturing method, the device separation area of burying type of the first embodiment of the present invention is completed.

Thereafter, the predetermined processes such as a gate oxidation and a gate electrode formation (not shown), are performed, so that a predetermined device is formed, and a semiconductor device is completed.

Next, a modification of the method for manufacturing the device separation area of burying type of the first embodiment will be explained with reference to FIGS. 18 to 25.

Figure 18:
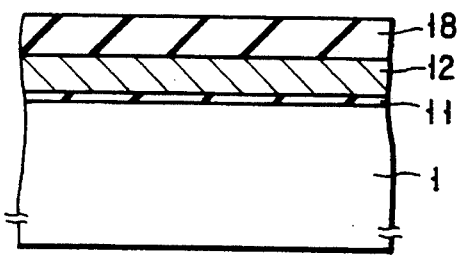
FIGS. 18 to 25 are cross sectional views of the main processes to explain a modification of the semiconductor manufacturing method having the device separation area of the first embodiment.

First, the polycrystalline silicon film 12 is formed by the same process as the process explained in FIG. 11. Thereafter, as shown in FIG. 18, a silicon nitrogen film (Si₃N₄) 18 having a thickness of about 100 nm is formed on the polycrystalline silicon film 12 by chemical vapor phase epitaxy.

Then, the silicon nitrogen film (Si₃N₄) 18 is coated with photoresist, thereby obtaining the photoresist film 13. Sequentially, the opening 14, which corresponds to an area where the device separation area is to be formed, is formed on the photoresist film 13.

Next, by use of the photoresist as a mask for etching, the silicon nitrogen film (Si₃N₄) 18 is etched RIE, which is anisotropic etching, thereby obtaining an opening 19 where the polycrystalline silicon film 12 is exposed.

Figure 20:
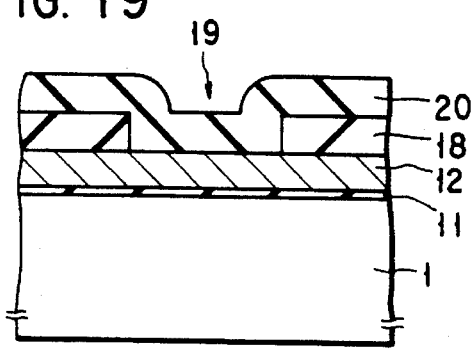

Next, after removing the photoresist 13, as shown in FIG. 20, a silicon nitrogen film (Si₃N₄) 20 having a thickness of about 50 nm is formed on the polycrystalline silicon film 12 and the silicon nitrogen film 18 by chemical vapor phase epitaxy.

Figure 21:
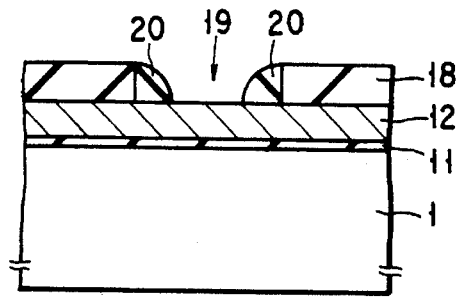

Then, as shown in FIG. 21, the entire surface of the silicon nitrogen film (Si₃N₄) 20 is etched back by anisotropic etching, and the silicon nitrogen film (Si₃N₄) 20 is left on the side surface of the opening 19.

Figure 22:
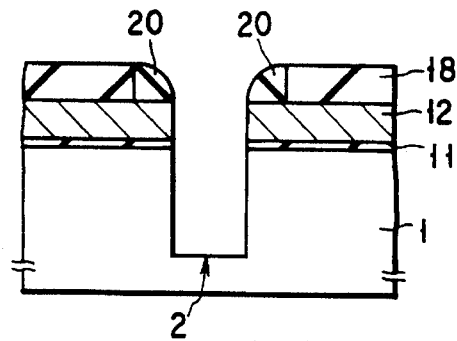

As shown in FIG. 22, by use of the silicon nitrogen films 18 and 20 serving as the mask for etching, the polycrystalline silicon film 12, silicon oxide film 11, and substrate 1 are sequentially etched by RIE, which is anisotropic etching, thereby obtaining the groove 2 of a depth of about 500 mn.

Figure 23:
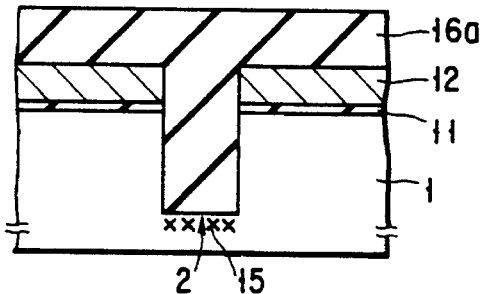

Then, as shown in FIG. 23, the silicon nitrogen films 28 and 20 are removed, and a silicon oxide film 16a is formed on the upper entire surface of the substrate 1 by the same process as the process of FIG. 13.

Figure 24:
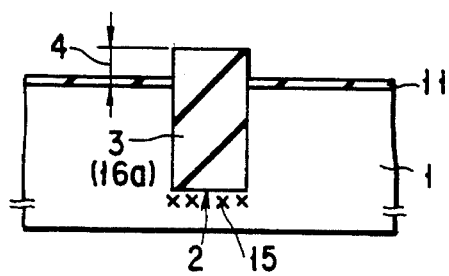

As shown in FIG. 24, by the same process as the process explained in FIGS. 14 and 15, the groove is buried with the silicon oxide film 16, so that the burying insulation film 3 is formed, the polycrystalline film 12 is removed by the burying insulation film 3 as the mask for etching, so that the projection 4, which projects from the surface of the substrate 1, is formed.

Figure 25:
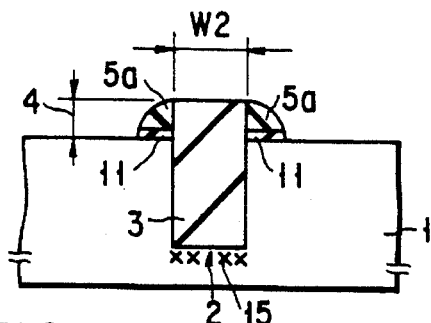

Then, as shown in FIG. 25, by the same process as the process explained in FIGS. 16 and 17, the silicon nitrogen film is left on the side wall of the projection 4, thereby forming the insulation film 5a, which is extended from the top portion of the projection 4 to the surface of substrate in a slope shape manner.

By the above-mentioned manufacturing method, the device separation area of burying type of the first embodiment can be formed.

Figure 19:
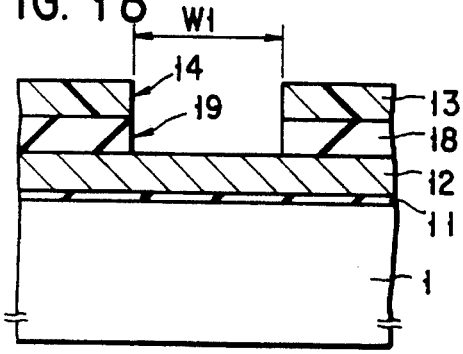

According to the manufacturing method of the above-mentioned modification, the size of the groove 2 can be made smaller than the size, which is determined by the limit of photographic etching. More specifically, if a wide W1 of the opening 14 of FIG. 19 is set as the size, which is determined by the limit of the photographic etching, a wide W2 of the groove 2, which is finally formed as shown in FIG. 25, is below W1. In other words, the wide W2 of the groove 2 is determined by the silicon nitrogen film 20 of side wall shape.

The following will explain the method for manufacturing the semiconductor device having the device separation area of burying type of the second embodiment of the present invention.

Figure 7:
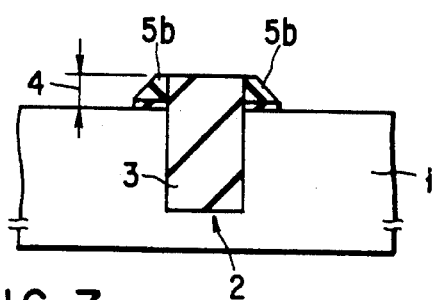

FIGS. 26 to 33 are cross sectional views of the main processes to explain the semiconductor manufacturing method having the device separation area of the second embodiment of FIG. 7.

Figure 26:
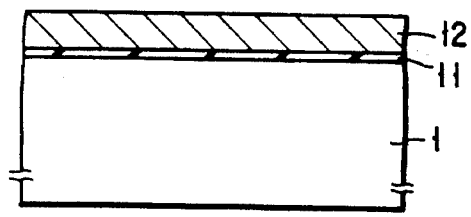

First, as shown in FIG. 26, silicon (Si) substrate 1 of P type having a face orientation (100) and a relative resistance of about 1 to 2 Ω·cm is oxidized in oxidizing atmosphere at temperature of 1000° C. Thereby, silicon oxide film (SiO₂) 11 having a thickness of about 15 nm as a protection film is formed on the surface of the substrate 1. The polycrystalline silicon film 12 having a thickness of about 250 nm is formed on the silicon oxide film 11 by CVD.

Figure 27:
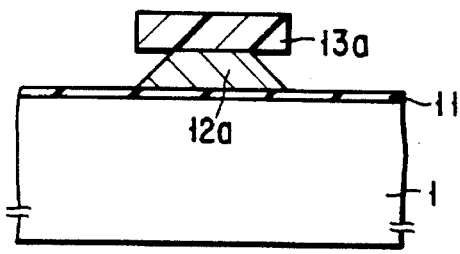

As shown in FIG. 27, the polycrystalline silicon film 12 is coated with photoresist, thereby obtaining a photoresist film. Then, a photoresist pattern which corresponds to the area where the device separation area is to be formed, is formed on the photoresist film 12 by photographic etching.

The photoresist pattern 13a is used as a mask for etching, thereby the polycrystalline silicon film 12 is etched. Then, a polycrystalline silicon film pattern 12a is formed on the area where the device separation area is to be formed. In this etching, RIE including a horizontal etching component is used. As a result, the side surface of the polycrystalline silicon film pattern 12a is inclined at about 45 degrees to the surface of the substrate 1 as shown in FIG. 27.

Figure 28:
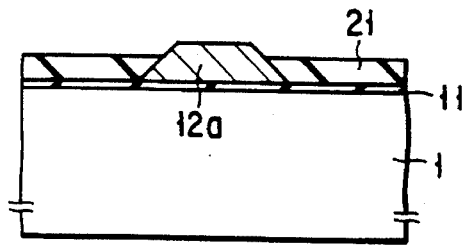

As shown in FIG. 28, after removing the photoresist pattern 13a, a silicon oxide film 21 having a thickness of about 150 nm is formed on only the surface of the exposed silicon oxide film 11 by liquid phase epitaxy. In the liquid phase epitaxy, solution of hydrofluoric acid in which silicon oxide is dissolved in a supersaturated manner is used. The substrate 1 having the structure in which the pattern 13a is removed is inserted into the above solution. As a result, the silicon oxide film 21 is formed on only a hydrophilic surface. Also, since the silicon oxide film 21 grows along the side wall of the polycrystalline silicon film pattern 12a, the outline of the pattern 12a and the inclination of the side surface are completely transferred to the silicon oxide film 21.

Figure 29:
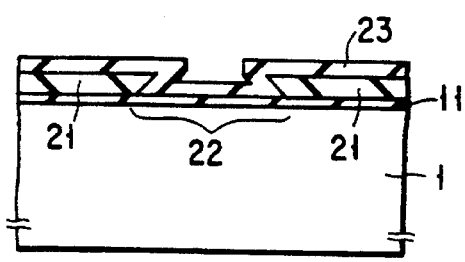

Sequentially, as shown in FIG. 29, by use of the silicon oxide film 21 as a mask for etching, the polycrystalline silicon film pattern 12a is removed by CDE (Chemical Dry Etching), and a space 22 whose side surface is inversely taped. Then, a silicon nitrogen film 23 is formed on the upper entire surface of the substrate 1 including the space 22 by CVD.

Figure 30:
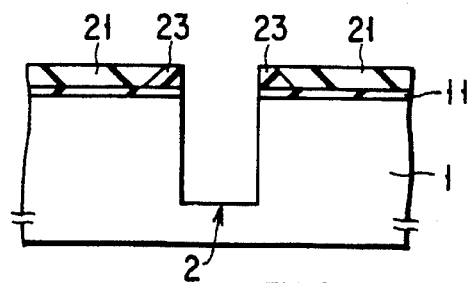
FIGS. 26 to 33 are cross sectional views of the main processes to explain the semiconductor manufacturing method having the device separation area of the second embodiment of FIG. 7.

Sequentially, as shown in FIG. 30, the silicon nitrogen film 23 is removed by RIE, which does not include the horizontal etching component. At this time, a part of the silicon nitrogen film 23 is formed on the inverse-taped side surface of the silicon oxide film 21. Then, by use of the silicon oxide film 21 and the silicon nitrogen film 23 as an etching mask, the silicon oxide film 11 and the substrate 1 are etched by RIE, so that the groove 2 having a depth of about 1.0 µm is formed in the substrate 1.

Figure 31:
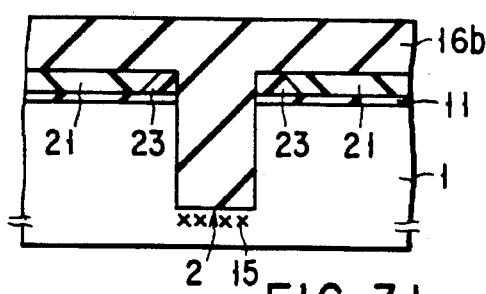

Sequentially, as shown in FIG. 31, by use of the silicon oxide film 21 and the silicon nitrogen film 23 as an etching mask, impurity of the same conductive type as the substrate 1 such as boron is ion-implanted into the substrate 1 exposed to the bottom of the groove 2 under a condition of accelerating voltage of 30 keV and dose of $5\times10^{12}/cm^{-2}$. Thereby, the ion implantation layer 15 can be obtained, and a silicon nitrogen film 16b having a thickness of about 1000 nm is formed on its structure by CVD. The ion implantation layer 15 is to be used as an inversion preventing layer.

Figure 32:
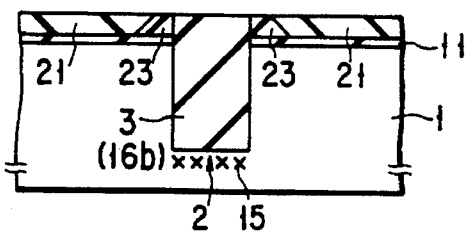

Next, as shown in FIG. 32, the silicon nitrogen film 16b is polished by a polishing method until the silicon oxide film 21 is exposed. Thereby, the silicon nitrogen film 16b is buried in the groove 2, and used as the burying insulation film 3. Also, the burying insulation film 3 is formed integrally with the silicon nitrogen film 23 at the side surface of the groove 2, and constitutes a T-shaped device separation area.

Figure 33:
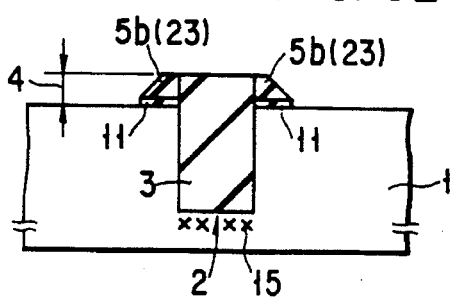

Next, as shown in FIG. 33, by use of the insulation film 3 and the silicon nitrogen films 23 as the etching mask, the silicon oxide film 21 is removed. Thereby, the nitrogen film pattern 24a is formed as the insulation film 5b in which the top portion of the projection 4 to the surface of the substrate 1 is formed in a slope shape.

By the above manufacturing method, the device separation area of burying type of the second embodiment of the present invention is completed.

Thereafter, the predetermined processes such as a gate oxidation and a gate electrode formation (not shown), are performed, so that a predetermined device is formed, and a semiconductor device is completed.

Next, a modification of the method for manufacturing the device separation area of burying type of the second embodiment will be explained with reference to FIGS. 34 to 39.

Figure 3:
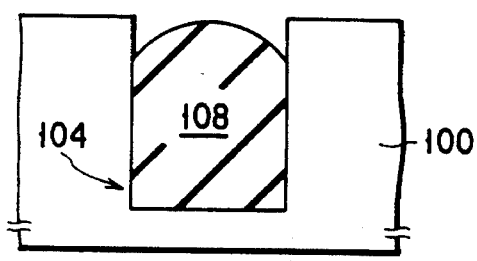
Figure 4:
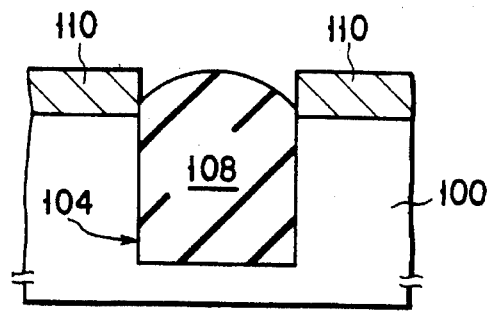
Figure 5:
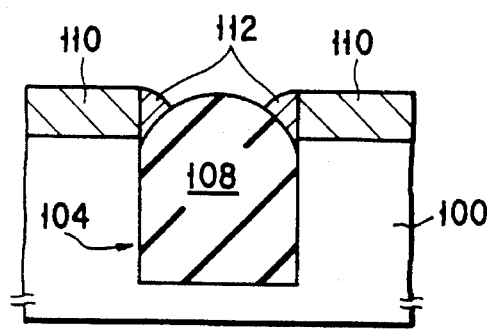
Figure 6:
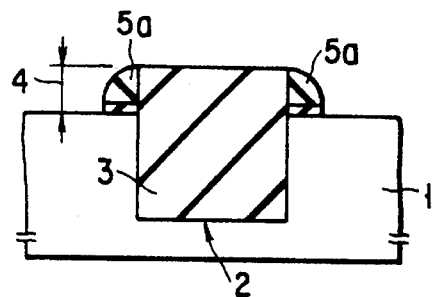
FIGS. 6 to 10 are cross sectional views each showing a device separation area having a different shape of embodiments 1 to 5 of the present invention.

First, as shown in FIG. 3,1, silicon (Si) substrate 1 of P type having a face orientation (100) of P type and a relative resistance of about 1 to 2 Ω·cm is oxidized in oxidizing atmosphere at temperature of 1000° C. Thereby, silicon oxide film ($SiO_2$) 11 having a thickness of about 15 nm as a protection film is formed on the surface of the substrate 1.

Figure 34:
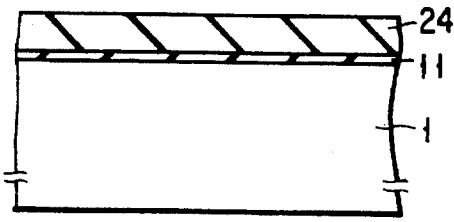
FIGS. 34 to 39 are cross sectional views of the main processes to explain a modification of the semiconductor manufacturing method having the device separation area of the second embodiment.

Then, as shown in FIG. 34, a silicon nitrogen film 24 having a thickness of about 250 nm is formed on the silicon oxide film 11 by CVD.

Figure 35:
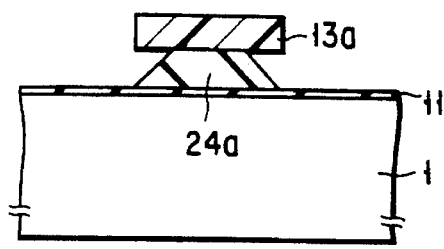

As shown in FIG. 35, the photoresist pattern 13a is formed on the silicon nitrogen film 24 by the same process as shown in FIG. 27. Then, the silicon nitrogen film 24 is etched by use of the photoresist pattern 13a as an etching mask, and a silicon nitrogen film pattern 24a, whose side surface is inclined at about 45 degrees to the surface of the substrate 1, is formed.

Figure 36:
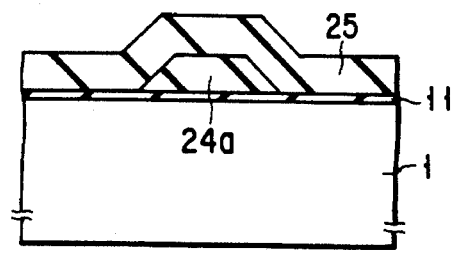

Next, as shown in FIG. 36, after removing the photoresist pattern 13a, a silicon oxide film 25 having a thickness of about 250 nm is formed on the oxide film 11 and the nitrogen film pattern 24a by CVD.

Figure 37:
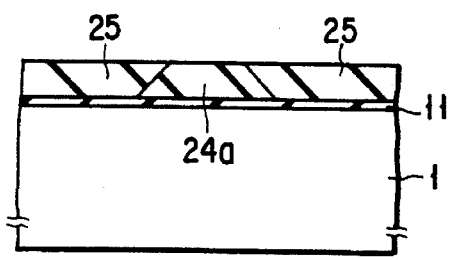

As shown in FIG. 37, the silicon oxide film 25 is polished by a polish method until the surface of the nitrogen film pattern 24a is exposed.

Figure 38:
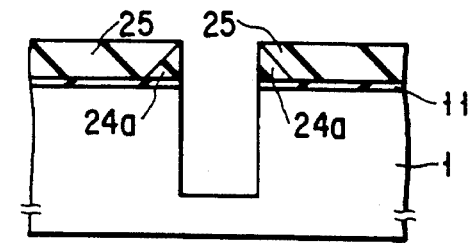

Next, as shown in FIG. 38, by use of the silicon oxide film 25 as a mask, the nitrogen film pattern 24a is etched back by RIE, which does not include the horizontal etching component. Thereafter, by use of the oxide film 25 and the nitrogen film pattern 24a as the mask, the oxide film 11 and the substrate 11 are etched by RIE, So that the groove 2 having a depth of about 1.0 µm is formed in the substrate 1.

Figure 39:
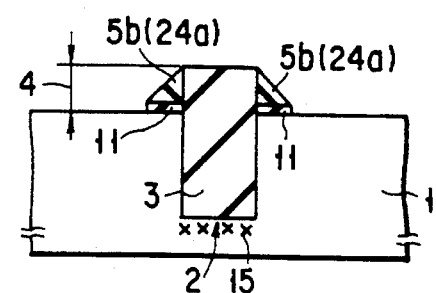

Next, as shown in FIG. 39, by use of the same processes as shown in FIGS. 31 to 33, the groove 2 is buried with the burying insulation film 3 (for example, silicon nitrogen film). Then, by use of nitrogen film pattern 24 and the insulation film 3 as the etching mask, as the etching mask, the silicon oxide film 21 is removed. Thereby, the nitrogen film pattern 24 is formed as the insulation film 5b in which the top portion of the projection 4 to the surface of the substrate 1 is formed in a slope shape.

By the above manufacturing method, the device separation area of burying type of the second embodiment of the present invention can be formed.

Figure 8:
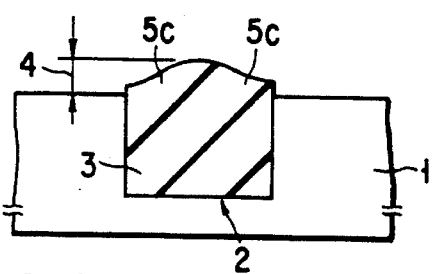

FIGS. 40 to 44 are cross sectional views of the main processes to explain the semiconductor manufacturing method having the device separation area shown in FIG. 8.

Figure 40:
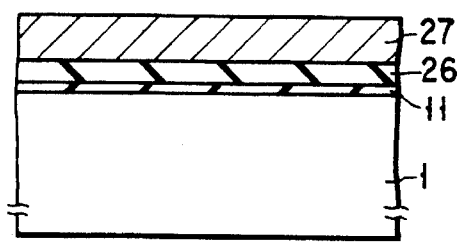
FIGS. 40 to 44 are cross sectional views of the main processes to explain the semiconductor manufacturing method having the device separation area of the third embodiment of FIG. 8.

First, as shown in FIG. 40, the silicon substrate 1 of P type having a face orientation (100) and a relative resistance of about 1 to 2 Ω·m is oxidized in oxidizing atmosphere at temperature of 1000° C. Thereby, the silicon oxide film 11 having a thickness of about 15 nm as a protection film is formed on the surface of the substrate 1. Then, a silicon nitrogen film 26 having a thickness of about 20 nm is formed on the silicon oxide film 11 by CVD. Sequentially, a polycrystalline silicon film 27 having a thickness of about 250 nm is formed on the silicon nitrogen film 26 by CVD.

Figure 41:
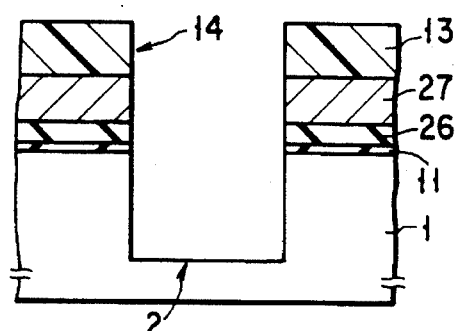

Then, as shown in FIG. 41, the polycrystalline silicon film 27 is coated with photoresist, thereby obtaining the photoresist film 13. Sequentially, the hole 14, which corresponds to the area where the device separation area is to be formed, is formed by photographic etching. Then, by use of the photoresist film 13 as the mask, the polycrystalline silicon film 27, silicon nitrogen film 26, silicon oxide film 11, and substrate 1 are etched by RIE, so that the groove 2 having a depth of about 1.0 µm is formed in the substrate 1.

Figure 42:
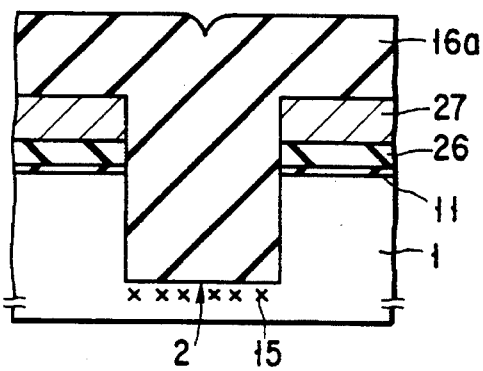

As shown FIG. 42, after removing the photoresist film 13, by use of the polycrystalline silicon film 27, silicon nitrogen film 26, and silicon oxide film 11 as the etching mask, boron is ion-implanted into the substrate 1 exposed to the bottom of the groove 2 under a condition of accelerating voltage of 30 keV and dose of $5\times10^{12}/cm^{-2}$. Thereby, the ion implantation layer 15 can be obtained, and a silicon nitrogen film 16a having a thickness of about 1000 nm is formed on the upper entire surface of the substrate 1 by CVD, and the groove is buried with the silicon oxide film 16a.

Figure 43:
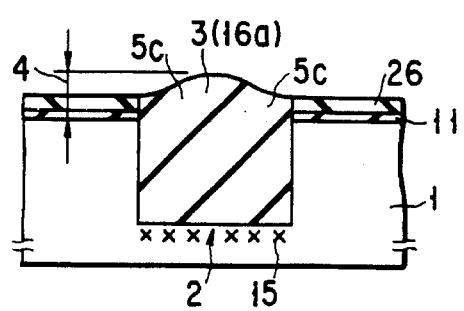

Next, as shown in FIG. 43, the silicon oxide film 16a, and the polycrystalline silicon film 27 are sequentially polished by the polish method until the silicon nitrogen film 26 is exposed. In the polish method, abrasive material or etchant is used. In other words, the etching rate becomes smaller in order of the polycrystalline silicon, oxide silicon, and nitrogen silicon. If the polishing is performed under this condition, the silicon oxide film 16a is first etched gradually. Then, at the time when the polycrystalline silicon film 27 is exposed, the polycrystalline silicon film 27 is largely etched than the silicon oxide film 16a. The end portion of the silicon oxide film 16a is smoothly etched. Moreover, at the time when the silicon nitrogen film 26 is exposed, the etching speed is drastically weak, and the substrate 1 is not etched. In other words, the silicon nitrogen film 26 functions as an etching stopper. In this way, there can be formed the burying insulation film 3, which has the projection 4 and the slope 5e and which is buried in the groove 2.

Figure 44:
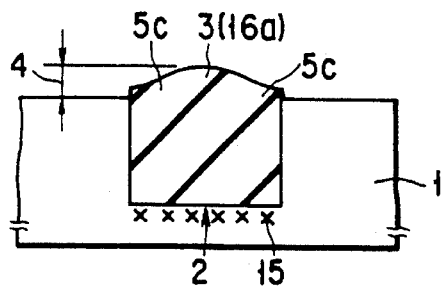

Then, as shown in FIG. 44, the burying insulation film (silicon oxide film) 3 is used as the mask by which removing the silicon nitrogen film 26 and the silicon oxide film 11.

By the above-mentioned manufacturing method, the device separation area of burying type of the third embodiment of the present invention is completed.

Thereafter, a predetermined device (not shown) is formed in the device area, so that a semiconductor device is completed.

Next, the following will explain a manufacturing method of the device separation area of burying type of a fourth embodiment of the present invention.

Figure 9:
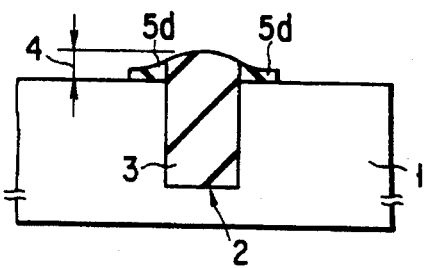

FIGS. 45 to 51 are cross sectional views of the main processes to explain the semiconductor manufacturing method having the device separation area shown in FIG. 9.

Figure 45:
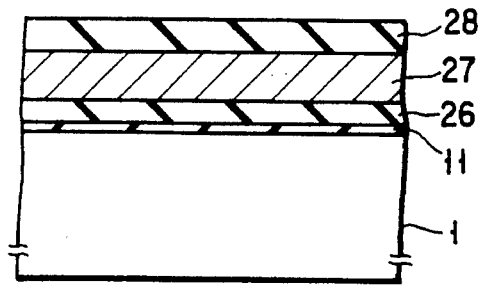

As shown in FIG. 45, by the same process as shown in FIG. 40, the silicon oxide film 11, silicon nitrogen film 26, and polycrystalline silicon film 27 are sequentially formed. Then, a silicon oxide film 28 having a thickness of about 50 nm is formed on the polycrystalline silicon film 27 by CVD.

Figure 46:
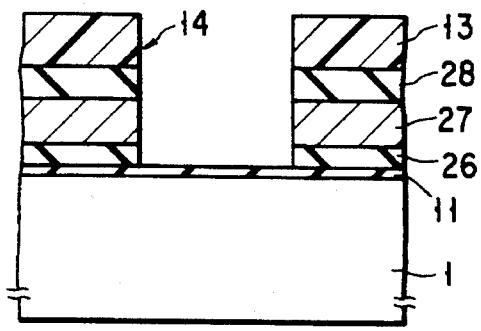

As shown in FIG. 46, the silicon oxide film 28 is coated with photoresist, thereby obtaining the photoresist film 13. Sequentially, the opening 14, which corresponds to the area where the device separation area is to be formed, is formed by photographic etching. Then, by use of the photoresist film 13 as the mask, the silicon oxide film 28, polycrystalline silicon film 27 and silicon nitrogen film 26 are etched by RIE.

Next, a silicon oxide film 29 having a thickness of about 50 nm is formed on the entire surface of the structure shown in FIG. 46 by CVD.

Figure 48:
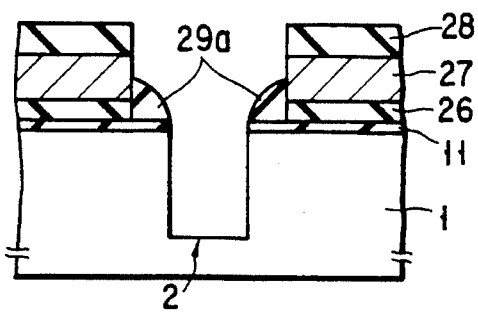
FIGS. 45 to 51 are cross sectional views of the main processes to explain the semiconductor manufacturing method having the device separation area of the fourth embodiment of FIG. 9.
Figure 47:
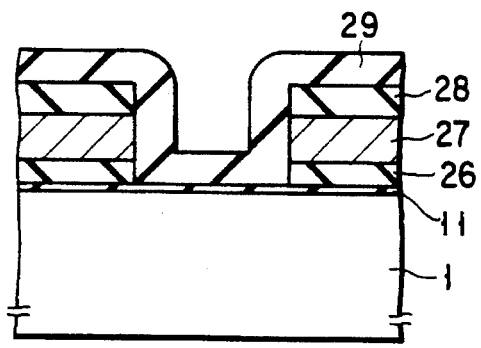
Figure 51:
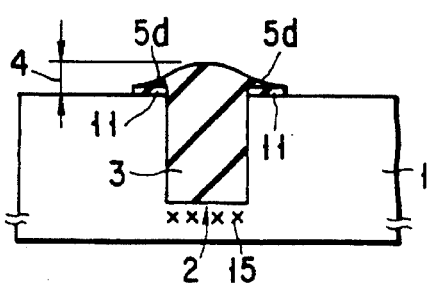

As shown in FIG. 48, the entire surface of the structure shown in FIG. 47 is etched back by RIE, so that a side wall insulation film 29a, made of silicon oxide film 29, can be obtained. At the same time, the silicon oxide film 11 is removed. Moreover, by use of the side wall insulation film 29a as the mask, the substrate 1 is etched, so that the groove having a depth of about 1.0 μm is formed in the substrate 1.

Figure 49:
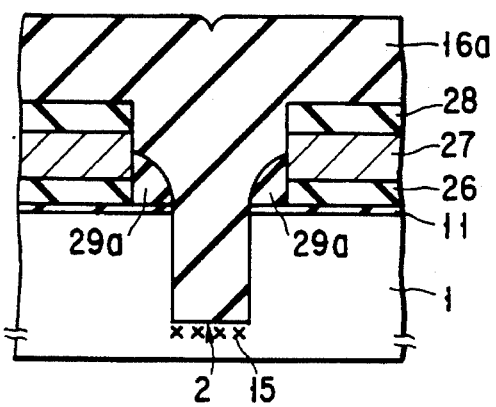

A shown in FIG. 49, by use of the same process as explained with reference to FIG. 42, the ion implantation layer 15 is formed in the substrate exposed to the bottom of the groove 2, and the silicon oxide film 16a having a thickness of about 1000 nm is formed on the upper entire surface of the substrate 1 by CVD.

Figure 50:
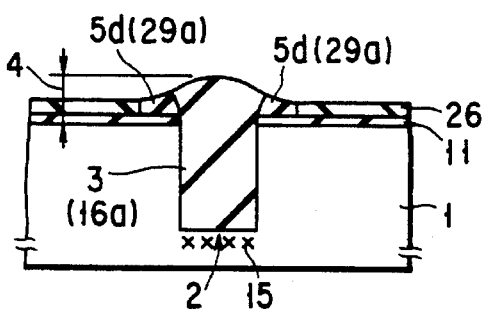

As shown in FIG. 50, the silicon oxide film 16a, the silicon oxide film 28, and the polycrystalline silicon film 27 are sequentially polished by the polish method until the silicon nitrogen film 26 is exposed. In this polish method, the condition as explained with reference to FIG. 43 is used.

Then, by use of the same process as explained with reference to the FIG. 44, the silicon nitrogen film 26 and the silicon oxide film 11 are removed.

By the above-mentioned manufacturing method, the device separation area of burying type of the fourth embodiment of the present invention is completed.

Thereafter, a predetermined device (not shown) is formed in the device area, so that a semiconductor device is completed.

Next, the following will explain a manufacturing method of the device separation area of burying type of a fifth embodiment of the present invention.

FIGS. 52 to 59 are cross sectional views of the main processes to explain the semiconductor manufacturing method having the device separation area shown in FIG. 9.

Figure 52:
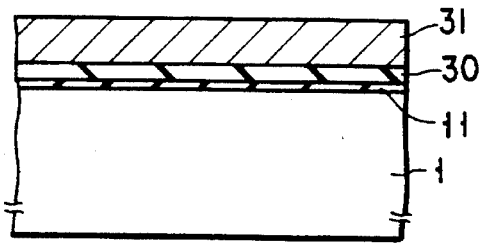
FIGS. 52 to 59 are cross sectional views of the main processes to explain the semiconductor manufacturing method having the device separation area of the fifth embodiment of FIG. 10.

First, as shown in FIG. 52, silicon Si) substrate 1 of P type having a face orientation (100) of P type and a relative resistance of about 1 to 2 Ω·m is oxidized in oxidizing atmosphere at temperature of 1000° C. Thereby, silicon oxide film ($SiO_2$) 11 having a thickness of about 15 nm as a protection film is formed on the surface of the substrate 1. Then, a silicon nitrogen film 30 having a thickness of about 50 nm, serving as an acid-proof film, a polycrystalline silicon film 31 having a thickness of about 150 nm, serving as an oxidizing film, are sequentially formed on the silicon oxide film 11 by CVD.

Figure 53:
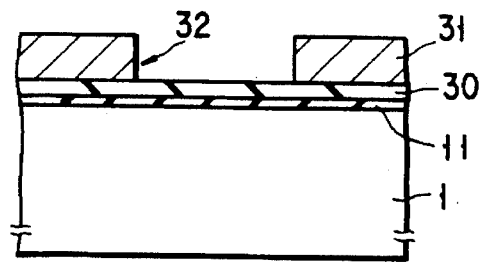

As shown in FIG. 53, the polycrystalline silicon film 31 is coated with photoresist, so that a photoresist film pattern (not shown can be obtained by patterning. Then, by use of the photoresist film pattern as a mask, the polycrystalline silicon film 31 is selectively removed by the photographic etching, an opening 32, which corresponds go an area where the device separation area is to be formed, is formed. In this case, the removal of the polycrystalline film 31 is performed by RIE, which is anisotropic etching.

Figure 54:
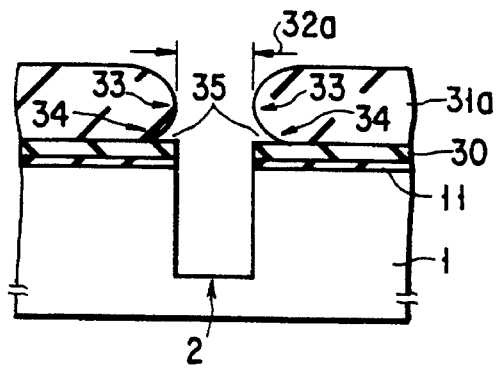

Then, as shown in FIG. 54, a photoresist film pattern (not shown) is removed. Thereafter, the polycrystalline silicon film 31 is completely oxidized in oxidizing atmosphere at temperature of 1000° C. At this time, the maximum thickness of the polycrystalline silicon film 31 is about 300 nm in order to generate a double volume expansion in the process of oxidization 10 (combination with oxygen). Also, the side wall is projected by about 0.04 μm (maximum) in the horizontal direction at the position of substantially half thickness of the final oxide film 31a (position shown by reference numeral 33), and about 0.01 μm (minimum) in the horizontal direction at the position in the vicinity of the semiconductor substrate (position shown by reference numeral 34). Due to this, the side wall of the oxide film 31 is arched in a stare that an arc connecting two points portion 33 and 34 is drawn.

Moreover, the diameter of the opening 32 formed by the process shown in FIG. 53 is narrower than the side wall the oxide film 31a. Then, by use of the oxide film 31 as the mask, the silicon nitrogen film 30, and the silicon oxide film 11 is removed, and the groove having a depth of 0.6 μm is formed in the substrate 1. In this case, the removal of the nitrogen film 30 and the oxide film 11 is used by RIE, which is suitable for each condition. In this stage, a space 35, which is generated when the oxide film 31a overhangs, is formed between the upper end portion of the groove 2 and the oxide film 31a.

Figure 55:
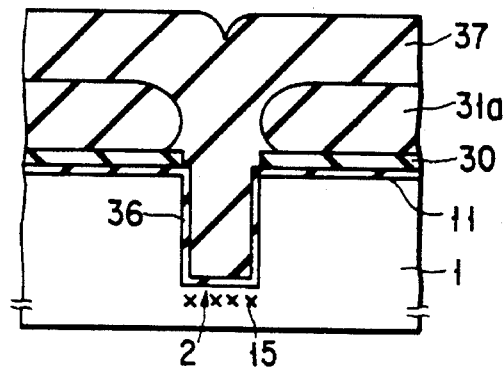

As shown in FIG. 55, the surface of the substrate 1 exposed to the groove 2 is oxidized in oxidizing atmosphere at temperature of 1000° C., so that a silicon oxide film 36, which has a thickness of 15 nm and which serves as an insulation film, is formed on the surface. Moreover, before or after forming the oxide film 36, boron is ion-implanted into the substrate 1 exposed to the bottom of the groove 2, so that the ion-implantation layer 15, serving as an inversion preventing layer, is obtained. Sequentially, a silicon nitrogen film 37 is formed on the upper entire surface of the substrate 1 by Low Pressure Chemical vapor Deposition (LPCVD). Thereby, the groove 2 and the space 35 are filled with the silicon nitrogen film 37.

Figure 56:
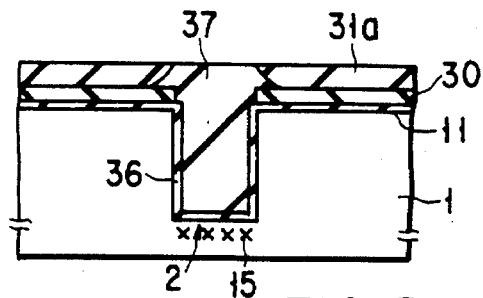

Sequentially, as shown in FIG. 56, the silicon nitrogen film 37 and the silicon oxide film 31a are uniformly polished up to about ⅔ of the maximum thickness of the oxide film 31a from the upper portion by the polish method. In this embodiment, the silicon nitrogen film 37 and the silicon oxide film 31a were polished up to 200 nm from the upper portion.

Figure 57:
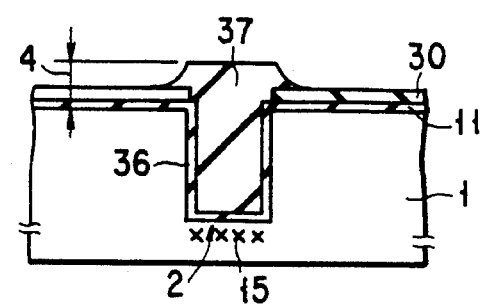

Sequentially, as shown in FIG. 57, only silicon oxide film 31a is etched and removed by fluoride solution, and the silicon nitrogen film 37 is exposed. At this time, the side wall of the nitrogen film 37 projected to the upper portion of the substrate 1 is smoothly arched by the influence of the shape of the space 35. Moreover, the height of the projection of the nitrogen film 37, which covers the substrate 21 in the vicinity of the groove 2, is about 150 nm from the surface of the substrate 1.

Figure 58:
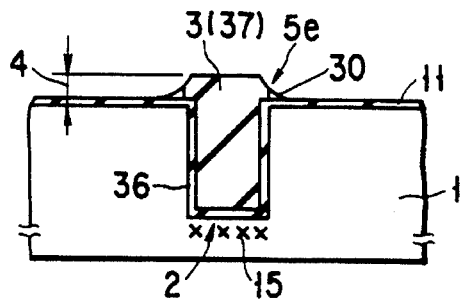

Then, as shown in FIG. 58, the silicon nitrogen film 30 is removed by CDE, which is isotropic etching. At this time, the silicon nitrogen film 30 is over-etched by adding about 40% of increase in speed to the reference etching speed to provide the thickness of about 30 nm. Therefore, the height of the projection of the nitrogen film 37, which covers the substrate 21 in the vicinity of the groove 2, is about 80 nm from the surface of the substrate 1, and the silicon nitrogen film 30 is slightly left on the end portion. Moreover, the shape of the surface is formed to be smoothly continuous to the surface of the substrate. At this stage, there can be obtained the insulation film 3, which is formed of silicon nitrogen films 30 and 37 covering the surface of the substrate, has the slope 5e, and buries the groove 2.

Figure 59:
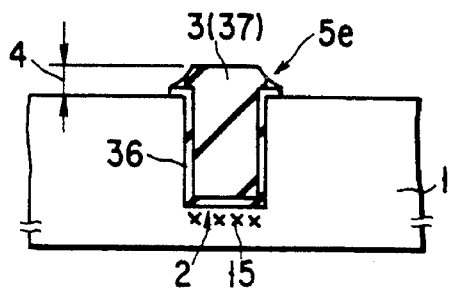

Then, as shown in FIG. 59, the thickness of about 25 nm of the silicon oxide film 11, which is formed on the device region, is etched by fluoride solution (ammonium fluoride) for 30 seconds and removed, so that the surface of the substrate 1 is exposed. Thereafter, a predetermined active device such as MOSFET, an interlayer insulation film, and a wiring are formed on the exposed surface of the substrate 1 of the device area by the well-known method (not shown), so that the semiconductor device is completed.

By the above-mentioned manufacturing method, the device separation area of the fifth embodiment of the present invention is completed.

Next, the following will explain a modification of the manufacturing method of the device separation area of burying type of the fifth embodiment of the present invention.

Figure 10:
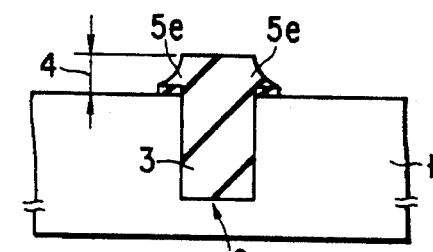
Figure 60:
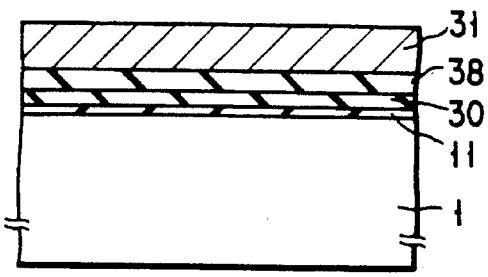
FIGS. 60 to 67 are cross sectional views of the main processes to explain a modification of the semiconductor manufacturing method having the device separation area of the fifth embodiment.

FIGS. 60 to 67 are cross sectional views of the main processes to explain the semiconductor manufacturing method having the device separation area shown in FIG. 10. First, as shown in FIG. 60, the silicon substrate 1 of P type having a face orientation (100) of P type and a relative resistance of about 1 to 2 Ω·m is oxidized in oxidizing atmosphere at temperature of 1000° C. Thereby, the silicon oxide film 11 having a thickness of about 15 nm as a protection film is formed on the surface of the substrate 1. Then, the silicon nitrogen film 30 having a thickness of about 50 nm, serving as the acid-proof film, a silicon oxide film 38 having a thickness of about 50 nm, and the polycrystalline silicon film 31 having a thickness of about 150 nm, serving as the oxidizing film, are sequentially formed on the silicon oxide film 11 by CVD.

Figure 61:
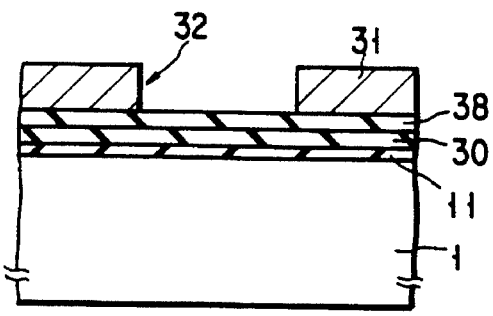

As shown in FIG. 61, by the same process as explained with reference to FIG. 53, the hole 32, which corresponds to the area where the device separation area is to be formed, is formed on the polycrystalline silicon film 31.

Figure 62:
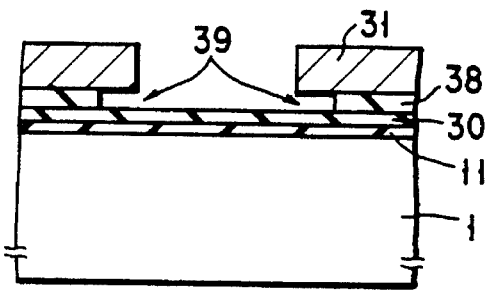

Sequentially, as shown in FIG. 62, a photoresist film pattern (not shown) is removed. Thereafter, the silicon oxide film 38 is over-etched by fluoride solution (ammonium fluoride), so that a space 39, in which the polycrystalline silicon film 31 overhangs, can be obtained. In this case, etching is performed under etching time of one minute and a thickness of about 100 nm. Thereby, the distance, which is from the side wall end portion of the polycrystalline silicon 31 to that of the silicon oxide film 38, is about 50 nm.

Figure 63:
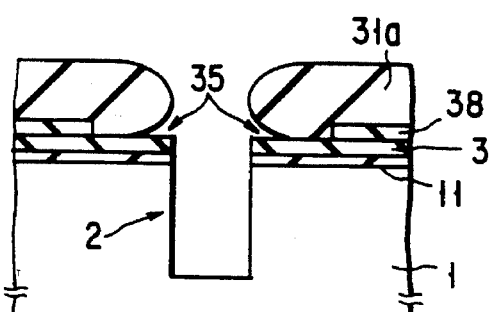

Then, as shown in FIG. 63, by the same process as explained with reference to FIG. 54, the polycrystalline silicon film 31 is changed to the silicon oxide film 31a. By use of the silicon oxide film 31a as the mask, the silicon nitrogen film 30, and the silicon oxide film 11 are removed, and the substrate 1 is etched. Thereby the groove 2 having a depth of 0.6 μm is formed. At this time, the maximum thickness of the polycrystalline silicon film 31 is about 300 nm in order to generate a double volume expansion in the process of oxidization. Also, the side wall is protruded by about 0.04 μm (maximum) at the position 33. Also, according to this modification, the space 39 is formed, and the protrusion at the position 34 close to the substrate 1 can be set to substantially zero in order to absorb the volume expansion in the space 39. Thereby, the side wall of the oxide film 31a is arched in a state that an arc connecting two points portion 33 and 34 is drawn. Moreover, since the protrusion at the position 34 close to the substrate 1 can be set to substantially zero, the space 35, which is generated when the oxide film 31a overhangs, can be made wider than the space 35 shown in FIG. 54.

Figure 64:
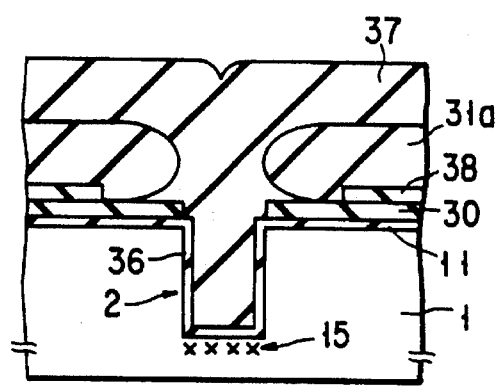

Sequentially, as shown in FIG. 64, by the same process as explained with reference to FIG. 55, the silicon oxide film 36 is formed on The surface of the substrate 1 exposed So the groove 2. The ion-implantation 15 is formed in the substrate 1 of the bottom of the groove 2, and the silicon nitrogen film 37 is formed such that the Groove 2 and the space 35 are buried.

Figure 65:
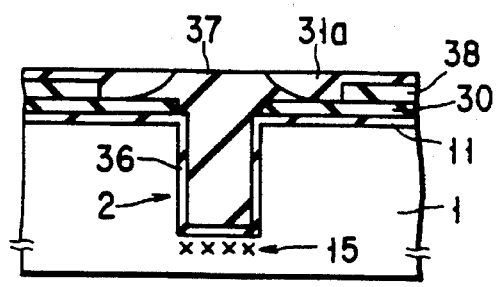

As shown in FIG. 65, the silicon nitrogen film 37 and the silicon oxide film 31a are uniformly polished up to about five-sixth of the maximum thickness of the oxide film 31a from the upper portion by the polish method. In this embodiment, the silicon nitrogen film 37 and the silicon oxide film 31a were polished up to 250 nm from the upper portion. Similar to the process explained in FIG. 56, this value is set such that 100 nm of the silicon oxide film 31a including the film thickness (50 nm) of the silicon oxide film 38 is left on the silicon nitrogen film 30.

Figure 66:
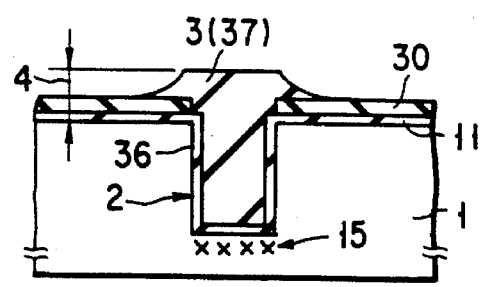

Next, as shown in FIG. 66, the silicon nitrogen film 37 is exposed by the same process as explained with reference to FIG. 57. At this time, the side wall of the silicon nitrogen film 37 is smoothly arched. As explained in FIG. 63, since the width of the space 35 is made wider, the arc is much smoothly drawn.

Figure 67:
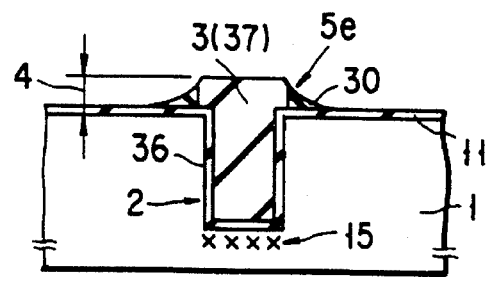

Sequentially, as shown in FIG. 67, the silicon nitrogen film 30 is removed by the same process as explained with reference to FIG. 58. Thereafter, the silicon oxide film 11, which is formed on the device area (non shown) is etched by fluoride solution (ammonium fluoride), and removed, and the surface of the substrate 1 is exposed. Moreover, a predetermined active device such as MOSFET, an interlayer insulation film, and a wiring are formed on the exposed surface of the substrate 1 of the device area by the well-known method, so that the semiconductor device is completed.

Next, the following will explain the other modification of the manufacturing method of the device separation area of burying type of the fifth embodiment of the present invention.

FIGS. 68 to 73 are cross sectional views of the main processes to explain the semiconductor manufacturing method having the device separation area shown in FIG. 10.

Figure 68:
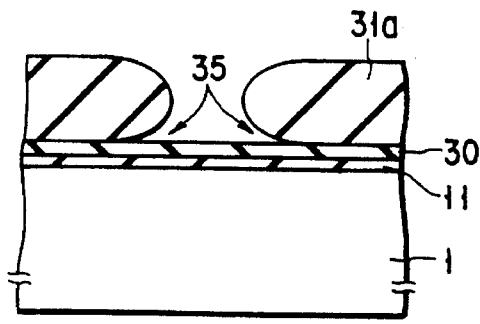
FIGS. 68 to 73 are cross sectional views of the main processes to explain another modification of the semiconductor manufacturing method having the device separation area of the fifth embodiment.

First, as shown in FIG. 68, the silicon oxide film 31a is formed by the same processes as explained with reference to FIGS. 52 to 54.

Figure 69:
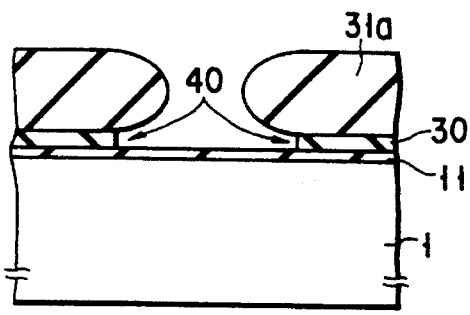

Sequentially, as shown in FIG. 69, by use of the silicon oxide film 31a as the mask, the silicon nitrogen film 30 is removed by CDE, which is isotropic etching. At this time, the nitrogen film 30 is retreated to the lower portion of the oxide film 31 from the space 35 to be moved, so that a space 40 is formed.

Figure 70:
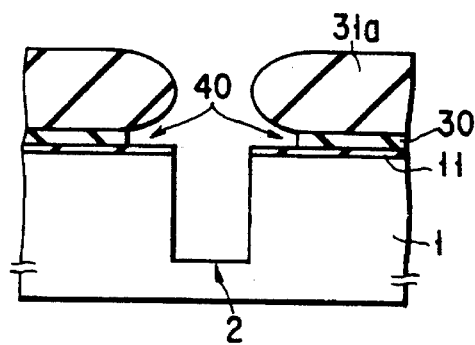

Then, as shown in FIG. 70, by use of the silicon oxide film 31*a* as the mask, the silicon oxide film 11 is removed, and the substrate 11 is etched, so that the groove having a depth of 0.6 mm is formed.

Next, by the same processes as explained with reference to FIGS. 55 and 56, the silicon oxide film 36 is formed on the surface of the substrate 1 exposed to the groove 2, and the ion-implantation 15 is formed in the substrate 1 of the bottom of the groove 2, and the silicon nitrogen film 37 is formed such that the groove 2 and the space 35 are burled.

Figure 71:
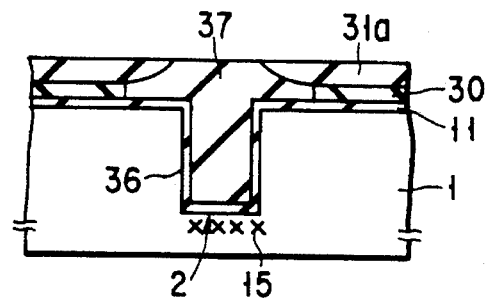

As shown in FIG. 71, the silicon nitrogen film 37 and the silicon oxide film 31*a* are uniformly polished from the upper portion by the polish method.

Figure 72:
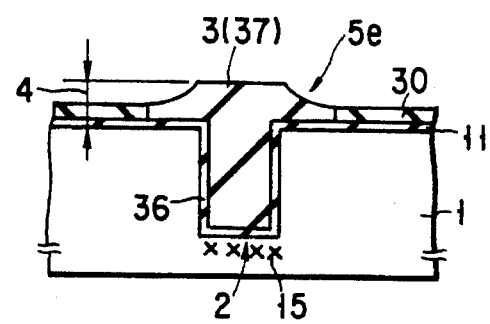
Figure 73:
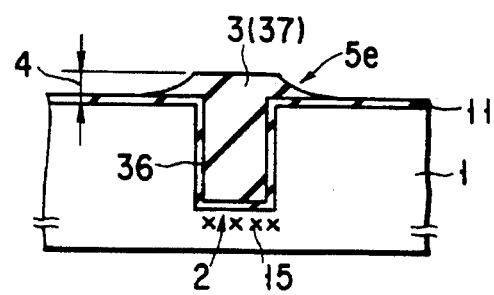

As shown in FIG. 72, only the silicon oxide film 31*a* is etched by fluoride solution and removed, and the silicon nitrogen film 37 is exposed. At this time, the side wall of the nitrogen film 37 projected to the upper portion of the substrate 1 is smoothly arched by influence of the shape of the space 40. In this stage, there can be formed the burying insulation film 3, which is buried in the groove 2, and formed of the silicon nitrogen film 37 covering the surface of the substrate 1, and has the slope 5*e*.

sequentially, as shown in FIG. 73, the silicon nitrogen films 30 and 37 are removed by CDE, which is isotropic etching. Also, according to this embodiment, since the nitrogen film 30 is retreated to the lower portion of the oxide film 31 from the space 35 to be removed, the silicon nitrogen film 30 can be prevented from being left on the portion in the vicinity of the end portion of the burying insulation film 3.

Thereafter, the silicon oxide film 11, which is formed on the device area (not shown) is etched by fluoride solution (ammonium fluoride), and removed, and the surface of the substrate 1 is exposed. Moreover, a predetermined active device such as MOSFET, an interlayer insulation film, and a wiring are formed on the exposed surface of the substrate 1 of the device area by the well-known method, so that the semiconductor device is completed.

According to the above-explained manufacturing method, the silicon nitrogen film 30 does not remain in the vicinity of the end portion of the insulation film 3. Therefore, the above-explained manufacturing method is useful for the case that the nitrogen film, which is formed in the vicinity of the end portion of the burying insulation film 3, of the other insulation material in place of the nitrogen film must be finally removed in view of the matter of insulation.

It is noted that the above-mentioned manufacturing method can be applied to the method explained with reference to FIGS. 60 to 67. In this case, in the processes of FIGS. 62 to 63, the polycrystalline silicon film 31 or the silicon oxide film 31*a* is used as the mask, and the nitrogen film 30 may be formed such that the space 40 is formed by CDE, which is isotropic etching.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method for manufacturing a semiconductor device comprising the steps of:

forming a first material film over a main surface of a semiconductor substrate;

forming a second material film on said first material film;

forming a third material film on said second material film;

etching said first, second, and third material films sequentially so as to form an opening;

forming a first insulating film on said third material film including said opening;

etching said substrate while etching said first insulation film by anisotropic etching so as to form a groove in said substrate and to form a side wall, formed of said first insulation film, on the substrate surface adjacent the groove;

burying at least said groove with a second insulation film;

etching said second insulation film, said second material film, and said first material film using a polishing process in which the etching rate of said second material film is larger than the etching rate of the second insulation film and the etching rate of the second insulation film is larger than the etching rate of the first material film; and removing said first material film by use of said first and second insulation films as an etching mask.

* * * * *